United States Patent
Yan

(10) Patent No.: US 6,501,332 B1
(45) Date of Patent: Dec. 31, 2002

(54) APPARATUS AND METHOD FOR ELECTRICAL SIGNAL AMPLIFICATION

(75) Inventor: Shouli Yan, College Station, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/615,377

(22) Filed: Jul. 13, 2000

(51) Int. Cl.[7] .............................. H03F 1/36; H03F 3/45
(52) U.S. Cl. .................... 330/85; 330/252; 330/260; 330/261
(58) Field of Search .................... 330/85, 252, 260, 330/261, 84, 147, 148

(56) References Cited

U.S. PATENT DOCUMENTS

| | | | | |
|---|---|---|---|---|
| 5,264,804 A | * | 11/1993 | Fox | 327/362 |
| 5,365,189 A | * | 11/1994 | Coulson | 330/126 |
| 5,659,264 A | * | 8/1997 | Ariyoshi et al. | 327/307 |
| 5,903,189 A | * | 5/1999 | Huijser | 330/146 |
| 6,222,416 B1 | * | 4/2001 | Edeler | 330/255 |
| 6,342,694 B1 | * | 1/2002 | Satoh | 250/214 A |

OTHER PUBLICATIONS

You, Fan, EMBABI, Sherif H.K., Sanchez–Sinencio, Edgar; "Multistage Amplifier Topologies with Nested Gm–C Compensation;" IEEEE Journal of Solid–State Circuits, vol. 32, No. 12; Dec., 1997; pp. 2000–2001.

* cited by examiner

*Primary Examiner*—Patricia Nguyen
(74) *Attorney, Agent, or Firm*—W. Daniel Swayze, Jr.; W. James Brady; Frederick J. Telecky, Jr.

(57) ABSTRACT

An apparatus and method for utilizing a correction loop amplifier in conjunction with a main amplifier to produce signal amplification with low total harmonic distortion. The correction amplifier preferably has one input directly coupled to a first input of the main amplifier, and an output coupled to a second input of the main amplifier via a resistor. The second input of the correction amplifier is preferably coupled to a signal input via a voltage divider or RC network. A preferred embodiment configuration provides a power amplifier with improved THD over prior art circuits. The circuit is very flexible, and may incorporate low, high or band pass filter functions if desired. In addition, the power amplifier may be implemented in any combination of single or differential inputs and outputs.

14 Claims, 8 Drawing Sheets

$$\frac{V_O}{V_I} = \frac{R_2}{R_1}$$

APPARATUS AND METHOD FOR ELECTRICAL SIGNAL AMPLIFICATION

This application is related to co-pending and commonly assigned U.S. patent application Ser. No. 09/491,543, filed Jan. 26, 2000, entitled A DISTORTION CORRECTION LOOP FOR AMPLIFIER CIRCUITS, which application is hereby incorporated herein by reference.

TECHNICAL FIELD

The present invention relates generally to an apparatus and method for electrical signal amplification, and more particularly to an apparatus and method for utilizing a correction loop amplifier in conjunction with a main signal amplifier to reduce output signal distortion.

BACKGROUND

Signal amplifiers are used in many types of electronic circuits in a wide variety of consumer, industrial and other products. One such application is a power amplifier that may be used to provide a large amount of signal amplification for audio equipment. A conventional prior art differential input power amplifier circuit is illustrated in FIG. 1. One problem with this circuit, however, is that it typically has relatively high total harmonic distortion ("THD"), and thus its direct use in high performance circuits is limited.

One approach to reducing the THD in a power amplifier circuit is taught by above-referenced U.S. patent application Ser. No. 09/491,543. FIG. 2 illustrates a low THD amplifier circuit 100 as disclosed by the above-referenced patent application. The transfer function of this circuit is generally given by $$v_O = \frac{A_m(s)[A_c(s)(1-k)+k]v_{I+} - A_m(s)kv_{I-}}{A_m(s)A_c(s)(1-k)k_2 + A_m(1-k)+1} \quad (1)$$

$$= \frac{\left[1 + \frac{k}{A_m(s)}\right]v_{I+} - \frac{k}{A_c(s)(1-k)}v_{I-}}{k_2 + \frac{1}{A_c(s)} + \frac{1}{A_m(s)A_c(s)(1-k)}}$$

where $$k = \frac{R_2}{R_1 + R_2}, \quad k_2 = \frac{R_4}{R_3 + R_4},$$

$A_m(s)$ and $A_c(s)$ are transfer functions of main amplifier 102 and correction loop amplifier 104, respectively.

Generally, to properly operate circuit 100, the output of correction amplifier 104 ($A_c(s)$) should be virtual ground. If the input is a completely fully differential signal (i.e., $v_{I+}=v_{I-}$) the following equations may be derived:

$$v_O \frac{R_4}{R_3 + R_4} = v_{I+}, \text{ and } v_O = \frac{R_2}{R_1}(v_{I+} - v_{I-}) = \frac{2R_2}{R_1}v_{I+}. \quad (2)$$

$$\text{Thus: } \frac{2R_2}{R_1} = \frac{R_3 + R_4}{R_4}.$$

Furthermore, if $R_4=R_1$, then $R_3=2R_2-R_1$.

In practical circuit design, it is generally difficult to match $R_3=2R_2-R_1$ to other resistors with values of $R_1$ or $R_2$.

If $A_m(s)>>0$, $A_c(s)>>0$ and $A_c(s)(1-k)>>0$, the above equation may be simplified to $$v_O = \frac{v_{I+}}{k_2} = \frac{R_3 + R_4}{R_4}v_{I+} = \left(\frac{R_3}{R_4}+1\right)v_{I+} \quad (3)$$

This indicates that the output voltage $v_o$ is mainly determined by the positive input $v_{1+}$, and is insensitive to the negative input $v_{1-}$. Essentially, the circuit may be operating as a single ended system, in which the input is $v_{1+}$ and the output is $v_o$. Therefore, a potential disadvantage with this circuit is that it may not be operating as a fully differential structure. Generally, in a mixed-signal environment, many of the digital noises are present in the power supply, substrate, or the signal wires, in a common mode fashion. In such an environment, a fully differential structure generally provides high (digital) noise immunization, a high Common-Mode Rejection Ratio ("CMRR"), and a high Power Supply Rejection Ratio ("PSRR"). However, because of the potential singled-ended operating characteristic of the circuit of FIG. 2, the benefits of a fully differential circuit may not be achieved.

For the circuit configuration shown in FIG. 2, the CMRR is:

$$CMRR = \frac{A_{DM}}{A_{CM}} = \frac{v_O/(v_{I+} - v_{I-})}{v_O/(v_{I+} + v_{I-})/2} = \frac{1}{2} = -6 \text{ dB} \quad (4)$$

Another potential disadvantage with the circuit illustrated in FIG. 2 is that it is relatively difficult to add a filtering function to the circuit.

SUMMARY OF THE INVENTION

These problems are generally solved or circumvented, and technical advantages are generally achieved, by preferred embodiments of the present invention comprising an apparatus and method for utilizing a correction loop amplifier in conjunction with a main amplifier to produce signal amplification with very low THD. The correction amplifier preferably has one input directly coupled to a first input of the main amplifier, and an output coupled to a second input of the main amplifier via a resistor. The second input of the correction amplifier is preferably coupled to a signal input via a voltage divider or RC network. Alternatively, the second input of the correction amplifier may be coupled to ground, typically for a single ended input negative gain configuration. A preferred embodiment configuration provides a power amplifier with improved THD over prior art circuits. The circuit is very flexible, and may incorporate low, high or band pass filter functions if desired. In addition, the power amplifier may be implemented in any combination of single or differential inputs and outputs.

In accordance with a preferred embodiment of the present invention, a power amplifier circuit apparatus comprises a main amplifier having first and second input nodes and an output node; a feedback resistor coupled between the first input node and the output node of the main amplifier; a correction loop amplifier having first and second input nodes and an output node, wherein the first input node of the correction amplifier is coupled to the first input node of the main amplifier; and a resistor coupled between the output node of the correction amplifier and the second input node of the main amplifier.

In accordance with another preferred embodiment of the present invention, a differential output amplifier circuit generates a balanced output signal having positive and negative signal components. The circuit comprises a first power amplifier circuit for providing the positive signal component of the balanced output signal, and a second power amplifier circuit for providing the negative signal component of the balanced output signal. Each of the first and second power amplifier circuits are configured similarly to the previously described embodiment.

In accordance with another preferred embodiment of the present invention, an amplifier circuit comprises a main amplifier and a correction amplifier, the main amplifier having first and second input nodes and an output node, and the correction amplifier having first and second input nodes and an output node. A method of correcting distortion in the amplifier circuit comprises feeding back an output signal from the main amplifier output node to the main amplifier first input node via a first resistor; feeding back the output signal to the correction amplifier first input node via the resistor; generating a correction signal at the output node of the correction amplifier; and providing the correction signal to the main amplifier second input node via a second resistor.

An advantage of a preferred embodiment of the present invention is that it provides much improved CMRR performance over prior art approaches. Assuming, ideal matching of resistors, and ideal main and correction amplifiers, the CMRR of the circuit should approach infinity. Practically, the CMRR of the circuit is limited by the matching of the resistors and the CMRR of the amplifiers. The higher CMRR generally provides higher immunization to digital interference and other common mode noise.

A further advantage of a preferred embodiment of the present invention is that it provides more gain flexibility than prior art approaches. The gain may be any value that is determined by $$\frac{R_2}{R_1},$$

so this preferred embodiment may be used to implement, for example, the volume control in the feedback loop of amplifier. For the prior art scheme discussed hereinabove, with $$\frac{v_O}{v_{I+}} = \frac{R_3}{R_4} + 1,$$

the minimum gain value is 1. Because the gain cannot be less than 1, it generally cannot be used in a volume control application.

A further advantage of a preferred embodiment of the present invention is that it provides configuration flexibility. For example, the amplifier could be configured to perform:

(1) fully-differential (balanced) input, single-ended output, 2-channel (4-channel) stereo;

(2) single-ended input, single-ended output, 2-channel (4-channel) stereo;

(3) fully-differential (balanced) input and output, mono (2-channel stereo);

(4) single-ended input, fully-differential (balanced) output, mono (2-channel stereo).

Configuration selection may be performed during design, or by using a few switches, after the circuit has been built. A basic design may be prepared beforehand, and then implemented in different configurations with a few wire connection changes.

A further advantage of a preferred embodiment of the present invention is that it is relatively easy to match all of the resistors, because each of the resistors is assigned one of two values.

A further advantage of a preferred embodiment of the present invention is that it is easy to extend the circuit to perform low pass, high pass, or band pass filter functions.

A further advantage of a preferred embodiment of the present invention is that it has extremely low THD compared with a conventional amplifier configuration.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a power amplifier configuration for use as an audio amplifier. The invention may also be applied, however, to other systems requiring electrical signal amplification. The circuit may be implemented with extremely low THD and used in high-end high-fidelity audio power amplifier chips. As another example, it may be used in low power codecs. For low-end applications that do not require high THD performance, higher THD may be traded off for lower power consumption. This relatively higher THD may still be at a level of performance comparable with that of conventional power amplifier designs. As another example, the low THD amplifier topology is generally process independent, so it may be used in any audio amplifier design implemented in CMOS, bipolar, or BiCMOS integrated circuits. It may also be implemented in a discrete component design, for example, for high-end audio power amplifier systems.

Figure 3:
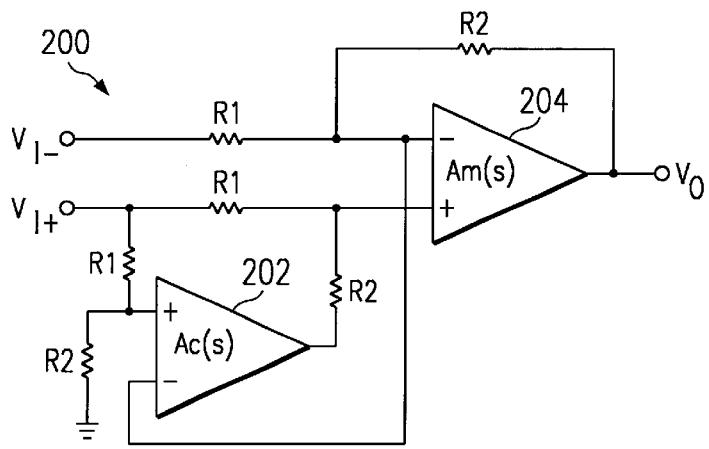
FIG. 3 is a schematic diagram of a preferred embodiment circuit comprising a correction amplifier with a input directly coupled to an input of a main amplifier.
Figure 4:
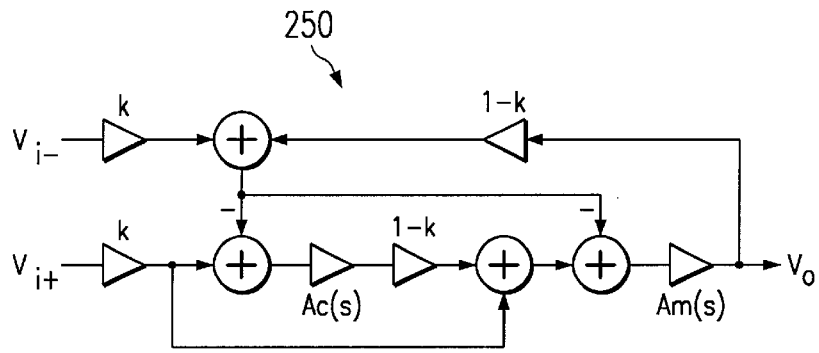
FIG. 4 is a signal flow diagram of the circuit in FIG. 3.

A schematic of a preferred embodiment double feedback loop fully differential to single ended amplifier is shown in FIG. 3, and the associated signal flow diagram 250 is shown in FIG. 4. The transfer function of this topology may be derived as follows. Assume both $A_c(s)$ correction loop amplifier 202 and $A_m(s)$ main amplifier 204 are 2-pole amplifiers, and their transfer functions are $$A_m(s) = \frac{A_{m0}}{\frac{s^2}{f_{m2}p_{m1}} + \frac{s}{p_{m1}} + 1}, \quad (5a)$$

and $$A_c(s) = \frac{A_{c0}}{\frac{s^2}{f_{c2}p_{c1}} + \frac{s}{p_{c1}} + 1}. \quad (5b)$$

Defining $$k = \frac{R_2}{R_1 + R_2},$$

the output voltage may be obtained as $$v_0(s) = \frac{kA_m(s)[1 + A_c(s)(1-k)]}{1 + A_m(s)A_c(s)(1-k)^2 + A_m(s)(1-k)}(v_{i+} - v_{i-}). \quad (6a)$$

In other words, the transfer function is $$H(s) = \frac{v_0(s)}{v_{i+} - v_{i-}} = \frac{kA_m(s)[1 + A_c(s)(1-k)]}{1 + A_m(s)A_c(s)(1-k)^2 + A_m(s)(1-k)} \quad (6b)$$

The most stringent condition for stability occurs when k=0, at which point the amplifier effectively works in a unity gain feedback configuration as a non-inverting amplifier. The gain of the amplifier then reduces to $$H(s) = \frac{kA_m(s)[1 + A_c(s)]}{1 + A_m(s)A_c(s) + A_m(s)} \quad (7)$$

$A_m(s)$ and $A_c(s)$ are then substituted with Equations (5a) and (5b). By multiplying the denominators of $A_m(s)$ and $A_c(s)$ for both of the numerator and denominator of Equation (7), the denominator of H(s) may be obtained as $$D_H(s) = \left(\frac{s^2}{f_{m2}p_{m1}} + \frac{s}{p_{m1}} + 1\right)\left(\frac{s^2}{f_{c2}p_{c1}} + \frac{s}{p_{c1}} + 1\right) + A_{m0}A_{c0} + A_{m0}\left(\frac{s^2}{f_{c2}p_{c1}} + \frac{s}{p_{c1}} + 1\right) \quad (8)$$

$$= A_{m0}A_{c0}\left[\frac{s^4}{f_{m2}f_{m1}f_{c2}f_{c1}} + s^3\frac{1}{f_{m1}f_{c1}}\left(\frac{1}{f_{m2}} + \frac{1}{f_{c2}}\right) + s^2\left(\frac{1}{f_{m2}f_{m1}A_{c0}} + \frac{1}{f_{c2}f_{c1}A_{m0}} + \frac{1}{f_{c2}f_{c1}A_{m0}} + \frac{1}{f_{m1}f_{c1}} + \frac{1}{f_{c2}f_{c1}}\right) + s\left(\frac{1}{f_{m1}A_{c0}} + \frac{1}{f_{c1}A_{m0}} + \frac{1}{f_{c1}}\right) + \left(1 + \frac{1}{A_{m0}A_{c0}} + \frac{1}{A_{c0}}\right)\right]$$

$$\underline{A_{m0} \gg 1, A_{c0} \gg 1} \; A_{m0}A_{c0}\left[\frac{s^4}{f_{m2}f_{m1}f_{c2}f_{c1}} + s^3\frac{1}{f_{m1}f_{c1}}\left(\frac{1}{f_{m2}} + \frac{1}{f_{c2}}\right) + s^2\frac{1}{f_{c1}}\left(\frac{1}{f_{m1}} + \frac{1}{f_{c2}}\right) + s\frac{1}{f_{c1}} + 1\right]$$

In a preferred embodiment, the transfer characteristic of FIG. 3 is given by $$v_0(s) = \frac{kA_m(s)[1 + A_c(s)(1-k)]}{1 + A_m(s)A_c(s)(1-k)^2 + A_m(s)(1-k)}(v_{i+} - v_{i-}) \approx \quad (9)$$

$$\frac{k}{1-k}(v_{i+} - v_{i-}) = \frac{R_2}{R_1}(v_{i+} - v_{i-})$$

Ideally, if the main and correction amplifiers have very high CMRR and the R1s and R2s are closely matched, then this topology should not introduce any CMRR degradation into the system, and higher immunization to digital interference and other common mode noise should be expected.

To examine stability conditions, it is useful to compare Equation (8) above with Equation (9) in the document, F. You et al., "Multistage amplifier topologies with nested Gm-C compensation," *IEEE J. Of Solid-State Circuits*, vol. 32, no.21, pp. 2000–2011 (December 1997), which document is hereby incorporated herein by reference. Using these equations, the following may be obtained:

$$f_1 = f_{c1}, \quad (10a)$$

$$f_2 = \frac{f_{m1}f_{c2}}{f_{m1} + f_{c2}}, \quad (10b)$$

$$f_3 = \frac{(f_{m1} + f_{c2})f_{m2}}{f_{m2} + f_{c2}}, \quad (10c)$$

$$f_4 = f_{m2} + f_{c2} \quad (10d)$$

where $f_{m1}=p_{m1}A_{m0}$ and $f_{c1}=p_{c1}A_{c0}$ are the unity gain frequencies of the main and correction amplifiers, and the $f_i$ (i=1 to 4) are the equivalent frequencies of the nested transconductance-capacitance compensation ("NGCC") amplifier of F. You et al.

Although the Routh stability criterion may be applied directly to obtain the stability requirements, it is generally very complex and requires significant mathematical work.

According to F. You et al., the stability condition is given by $$f_4 > f_2, \text{ and } f_4 > f_2 \frac{1}{1 - f_1/f_3}.$$

That is, for the preferred embodiment amplifier in FIG. 3, the stability condition is:

$$f_{m2} + f_{c2} > \frac{f_{m1} f_{c2}}{f_{m1} + f_{c2}}, \qquad (11a)$$

and $$f_{m2} + f_{c2} > \frac{f_{m1} f_{m2} f_{c2}}{f_{m2}(f_{c2} + f_{m1}) - f_{c1}(f_{c2} + f_{m2})} \qquad (11b)$$

Because equation (11a) is generally always true, equation (11b) becomes the only requirement for stability.

If $f_{c1}=1$ MHZ, $f_{c2}=3$ MHz, $f_{m1}=3$ MHz, and $f_{m2}=6$ MHz, the following values may be obtained: $f_1=1$ MHz, $f_2=1.5$ MHz, $f_3=4$ MHz, and $f_4=9$ MHz.

Examining the THD of the circuit shown in FIG. 3, the THD is primarily dependent on the total gain of the feedback loop. As a rule of thumb, the THD improvement is given by $$THD = -20 \log\left[\left(\frac{f_{c1} f_{m1}}{f_H^2}\right)(1-k)^2\right], \qquad (12)$$

where $f_H$ is the highest working frequency of the amplifier. For example for audio compact disc player amplifiers, $f_H$ should be about 20 KHz.

In accordance with other preferred embodiments, filtering functions, such as low pass, high pass, and band pass may be incorporated into the amplifier. The low pass filter function may be particularly useful for some applications because it is desirable to eliminate some high frequency component switched-capacitor noise or D/A converter noise at sample frequency.

Figure 5:
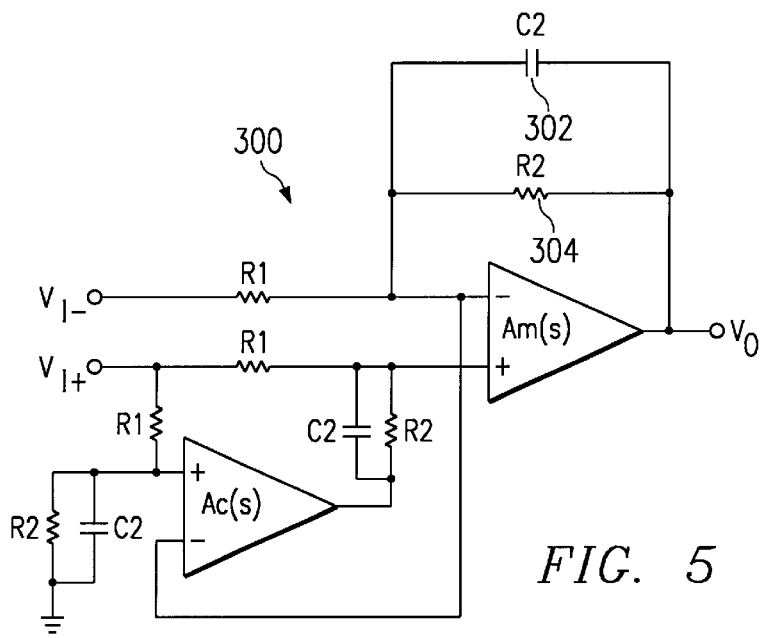
FIG. 5 is a schematic diagram of a preferred embodiment low pass filter.

(1) Low pass filter. For a $1^{st}$ order low pass filter, a capacitor (C2) 302 is added in parallel with every R2 304 in amplifier circuit 300 illustrated in FIG. 5. The low pass transfer function is roughly given by:

$$A_{LP}(s) = \frac{R_2}{R_1} \frac{1}{1 + \frac{s}{p_2}} \qquad (13)$$

where $p_2$ is the -3 dB angular frequency, which is given by $$p_2 = \frac{1}{R_2 C_2}.$$

The -3 dB frequency (in Hz) is, $$f_{-3dB} = \frac{p_2}{2\pi} = \frac{1}{2\pi R_2 C_2}.$$

Figure 6:
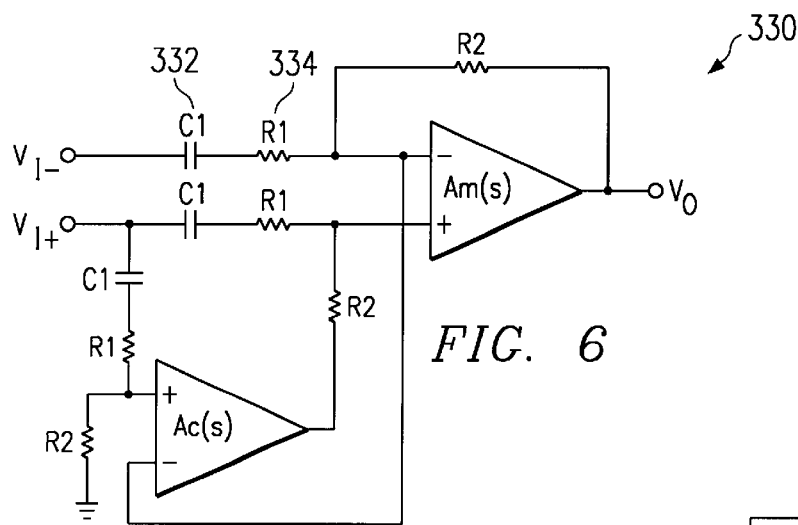
FIG. 6 is a schematic diagram of a preferred embodiment high pass filter.

(2) High pass filter. For a $1^{st}$ order high pass filter, a capacitor (C1) 332 is added in series with every R1 334 in amplifier circuit 330 illustrated in FIG. 6. The high pass transfer function is generally given by:

$$A_{HP}(s) = \frac{R_2}{R_1} \frac{s}{1 + \frac{s}{p_1}} \qquad (14)$$

where $p_1$ is the -3 dB high pass angular frequency, which is given by $$p_1 = \frac{1}{R_1 C_1}.$$

Figure 7:
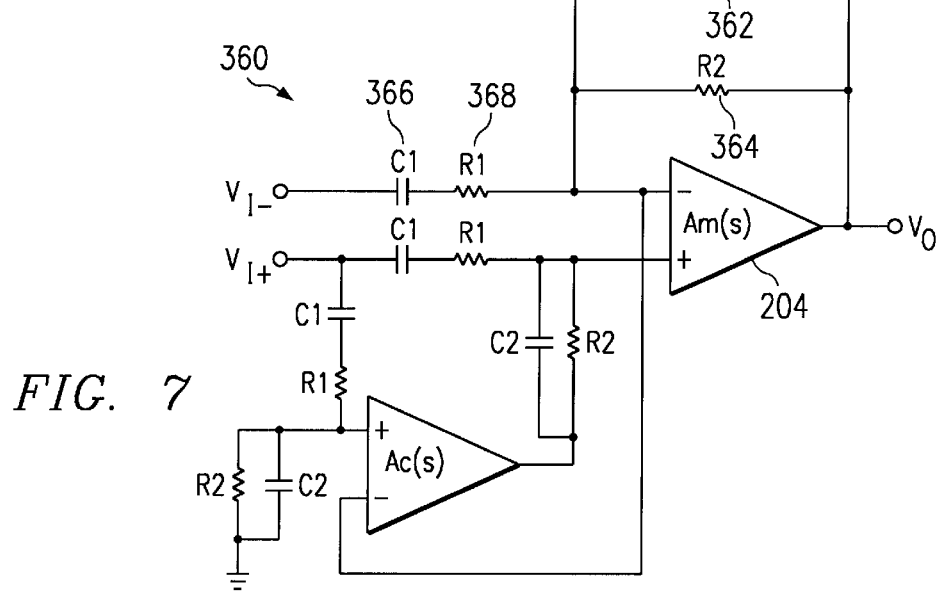
FIG. 7 is a schematic diagram of a preferred embodiment band pass filter.

(3) Band pass filter. For a $1^{st}$ order band pass filter, the low pass and high pass implementations may be combined together. In other words, a capacitor (C2) 362 is added in parallel with every R2 364, and a capacitor (C1) 366 is added in series with every R1 368, in amplifier circuit 360 illustrated in FIG. 7. The band pass transfer function is generally given by:

$$A_{BP}(s) = \frac{R_2}{R_1} \frac{s}{\left(1 + \frac{s}{p_1}\right)\left(1 + \frac{s}{p_2}\right)} \text{ where } p_1 = \frac{1}{R_1 C_1} \text{ and } p_2 = \frac{1}{R_2 C_2}. \qquad (15)$$

Alternatively, if the square wave transient response is desirable for a particular application, a small capacitor C2 (e.g., C2=10 p, and R2=50K) may be beneficial.

Figure 8:
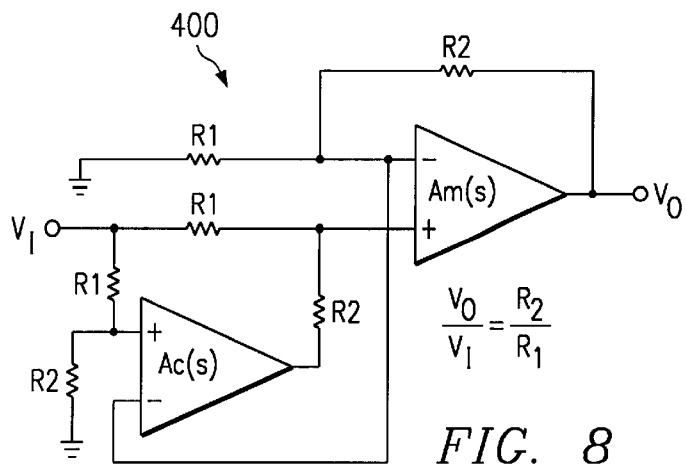
FIG. 8 is a schematic diagram of a positive gain single ended input configuration.
Figure 9:
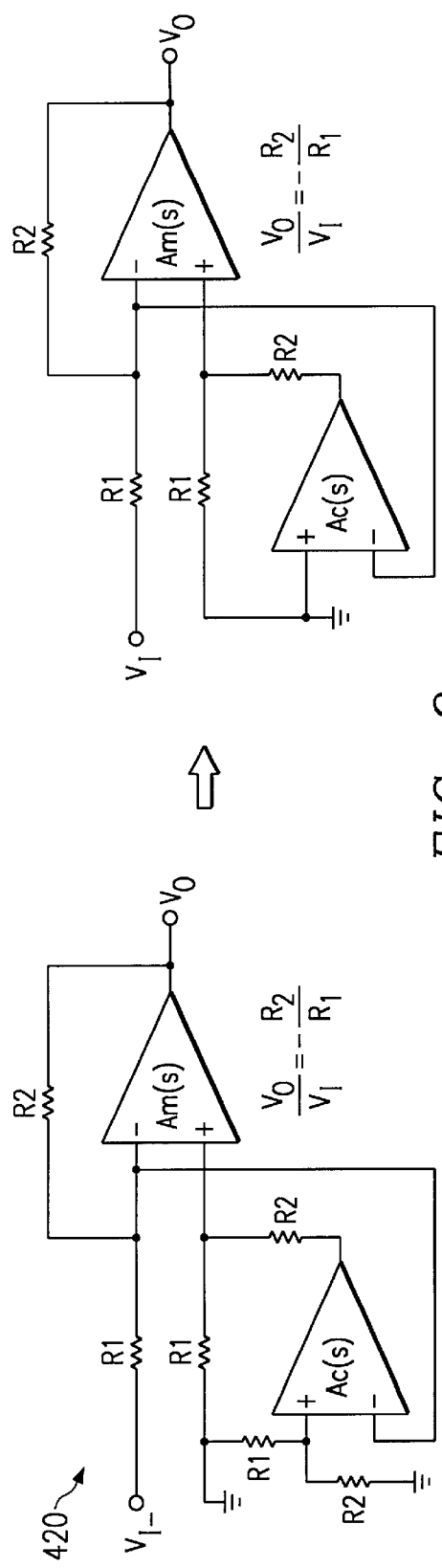
FIG. 9 is a schematic diagram of a negative gain single ended input configuration.

In accordance with other preferred embodiments, the circuit topology described above may be implemented in configurations other than fully-differential to single-ended. For example, by shorting one input to analog ground, a single-ended to single-ended configuration may be configured. Depending on which input is shorted to ground, the gain may be positive or negative, as illustrated in FIGS. 8 & 9. FIG. 8 illustrates single-ended to single-ended power amplifier 400 with positive gain, while FIG. 9 illustrates single-ended to single-ended power amplifier 420 with negative gain.

Figure 10:
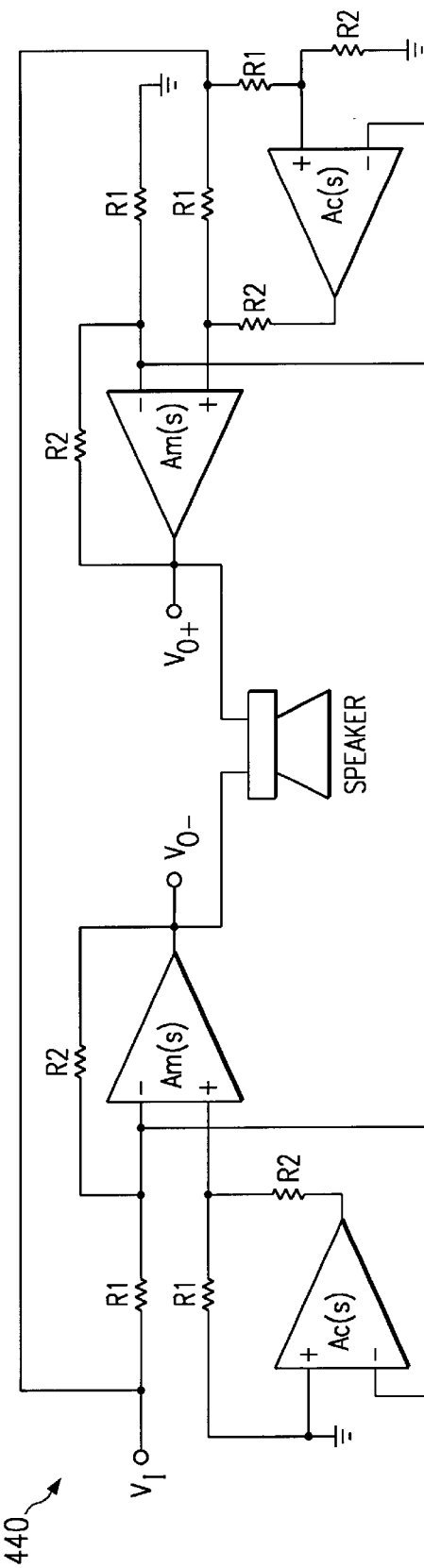
FIG. 10 is a schematic diagram of a single ended input, balanced output configuration.
Figure 11:
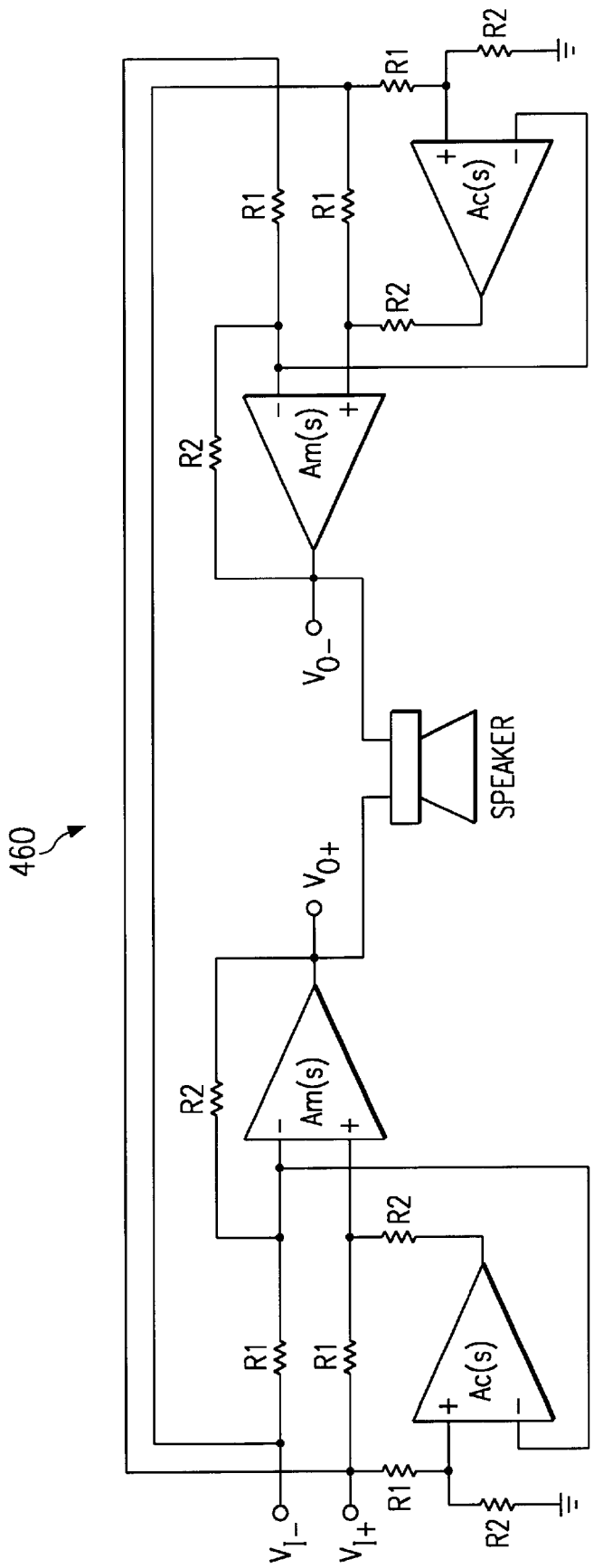
FIG. 11 is a schematic diagram of a balanced input and output configuration.

In accordance with other preferred embodiments, the amplifier may be configured as singled-ended input, fully-differential (balanced) output amplifier 440, as shown in FIG. 10, or as fully-differential (balanced) input-output amplifier 460, as illustrated in FIG. 11. The circuit in FIG. 10 effectively combines the positive gain amplifier of FIG. 8 with the negative gain amplifier of FIG. 9 to provide a fully differential output. Similarly, the circuit of FIG. 11 effectively combines two amplifiers of the embodiment illustrated in FIG. 3, with the inputs reversed into one of the amplifiers.

Figure 12:
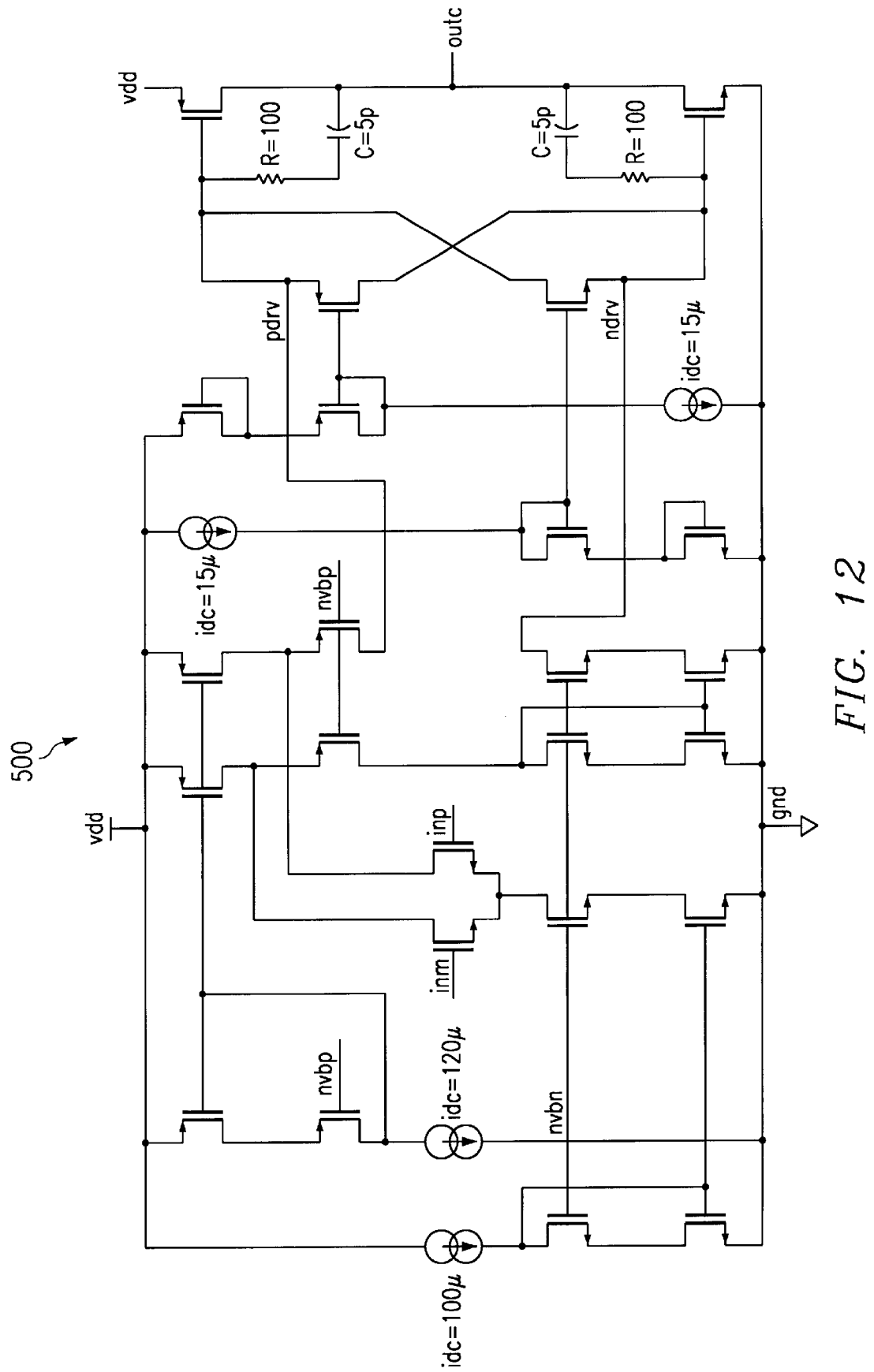
FIG. 12 is a schematic diagram of a main amplifier.
Figure 13:
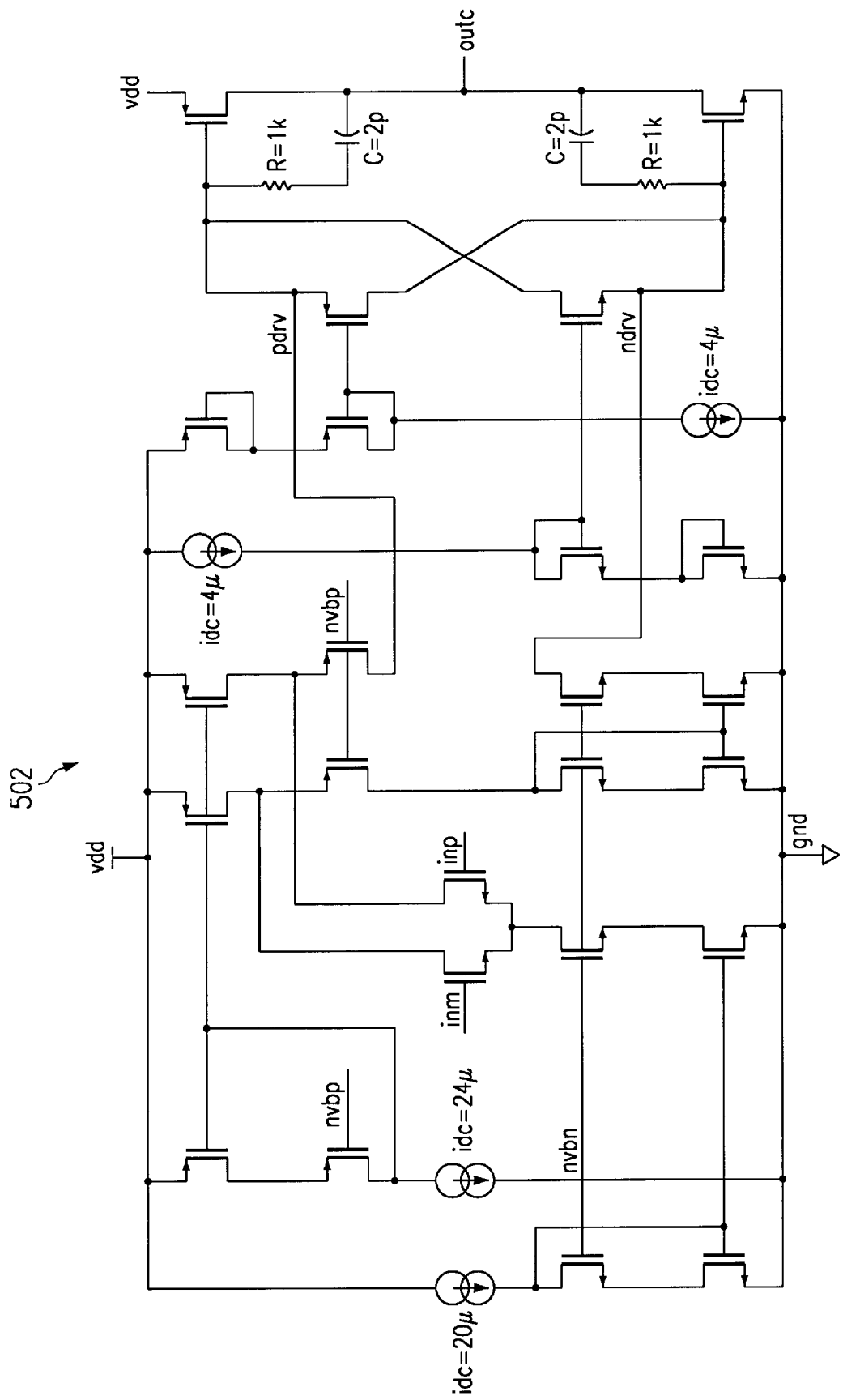
FIG. 13 is a schematic diagram of a correction amplifier.
Figure 14:
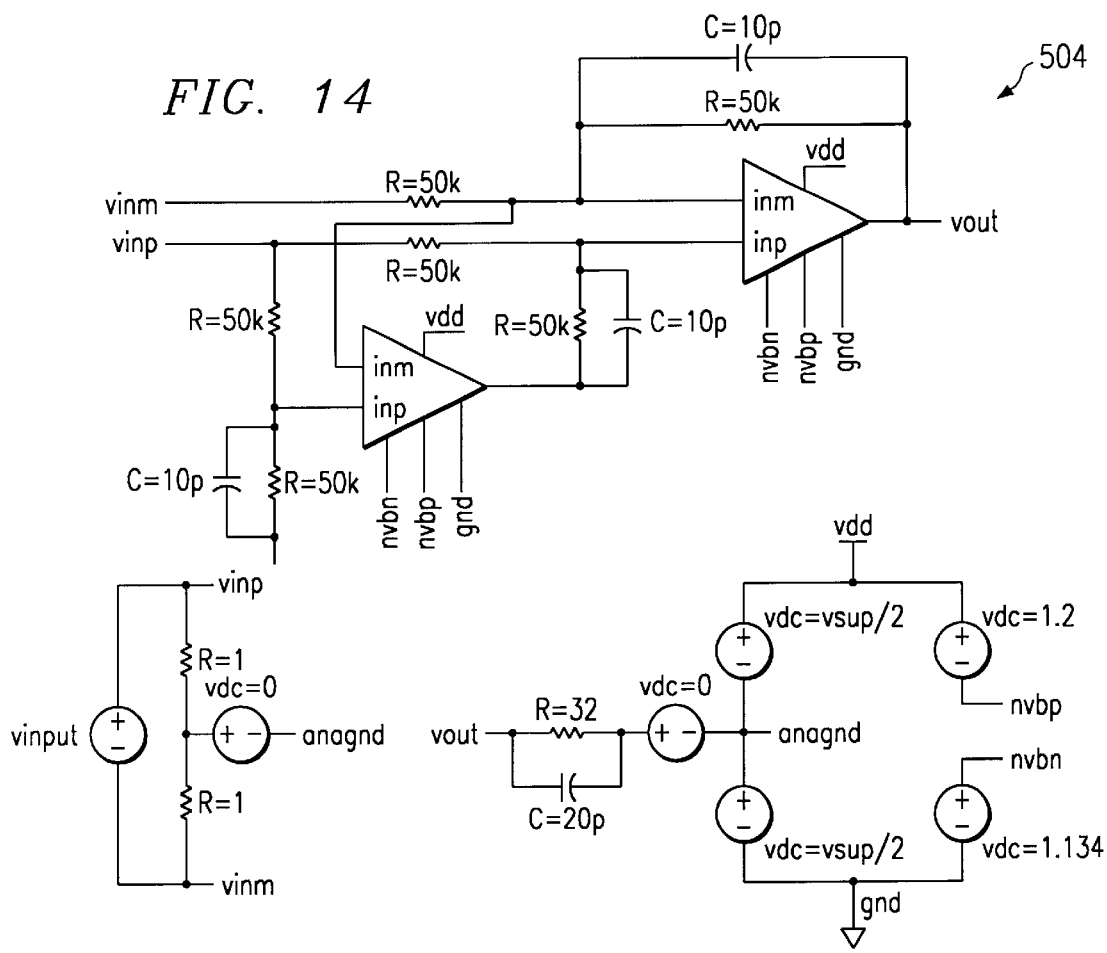
FIG. 14 is a schematic diagram of a preferred embodiment power amplifier.

As one of ordinary skill in the art would readily appreciate, there are many possible transistor level implementations for the main and correction amplifiers. FIG. 12 illustrates a preferred transistor level implementation 500 for main amplifier 204, and FIG. 13 illustrates a preferred transistor level implementation 502 for correction amplifier 202. FIG. 14 illustrates schematic 504 of a preferred embodiment amplifier in a fully-differential to single-ended scheme configuration.

Figure 1:
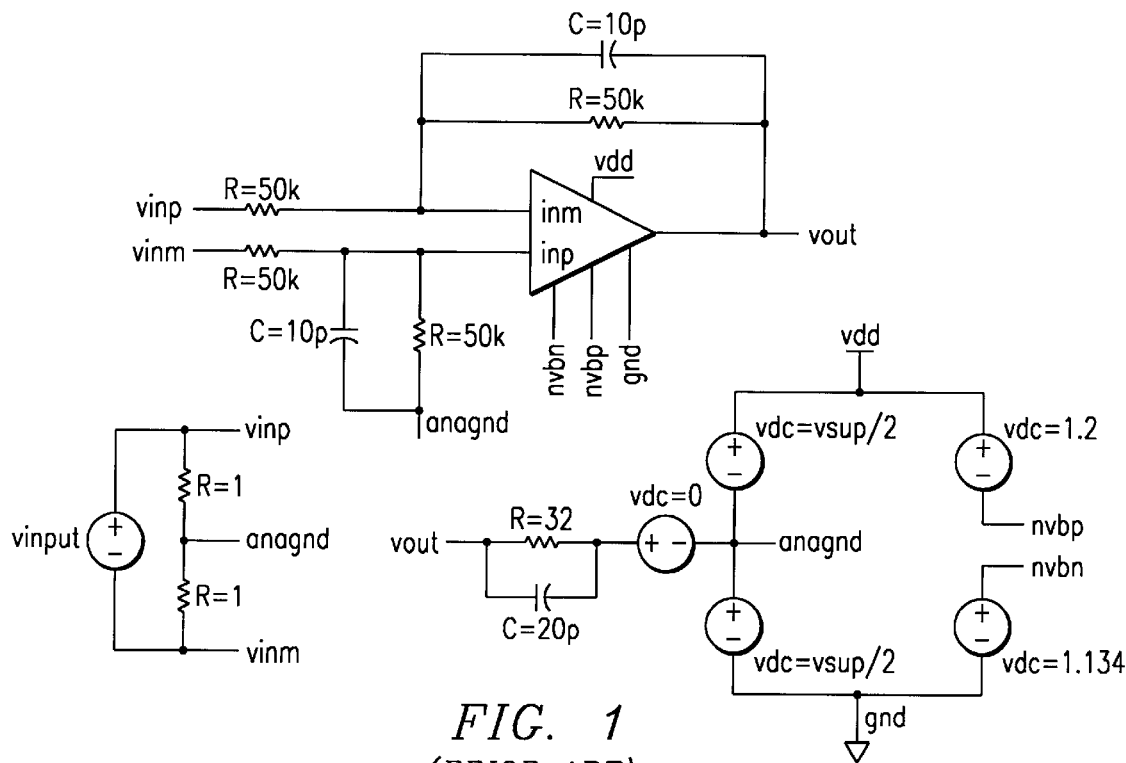
FIG. 1 is a schematic diagram of a prior art amplifier.
Figure 2:
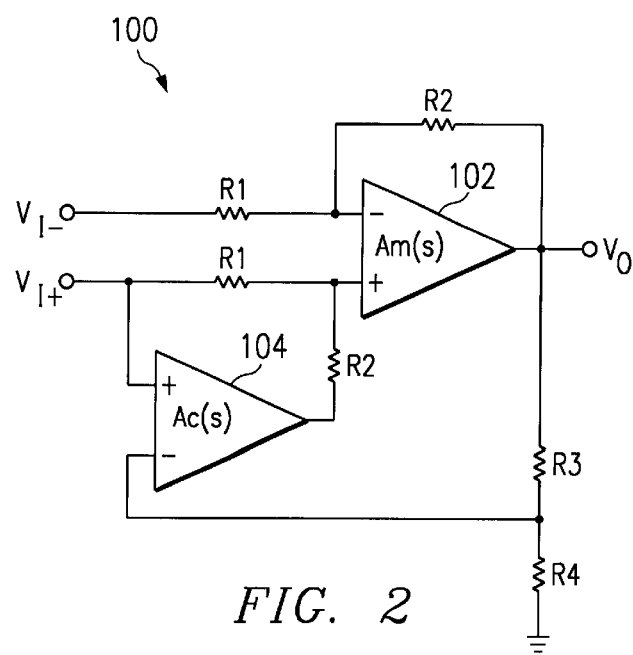
FIG. 2 is a schematic diagram of an amplification circuit comprising a correction amplifier with an input coupled to an output of a main amplifier via a voltage divider.
Figure 15:
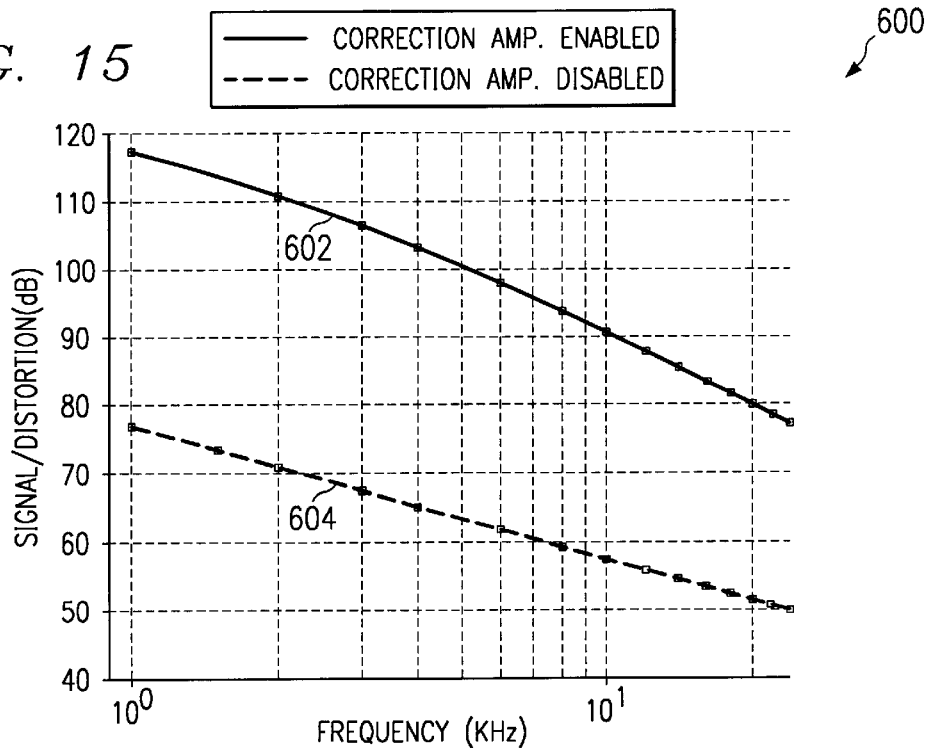
FIG. 15 is a graph of signal/distortion ratio versus frequency.

Referring now to FIG. 15, graph 600 illustrates simulation results of signal to distortion ratio versus frequency. In the simulation, $R_L=32\Omega$, $V_{sup}=2.5V$, and $V_{out}=2.0$ Vp-p. Curve 602 represents the signal to distortion ratio for preferred embodiment amplifier circuit 504 in FIG. 14, while curve 604 represents the signal to distortion ratio of the prior art circuit of FIG. 1. Advantageously, curve 602 shows a 28 dB–50 dB improvement over curve 604.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware or firmware, or a combination thereof, running on one or more computers. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A power amplifier circuit comprising:
   a main amplifier having first and second input nodes and an output node;
   a feedback resistor coupled between said first input node and said output node of said main amplifier;
   a correction loop amplifier having first and second input nodes and an output node, wherein said first input node of said correction amplifier is coupled to said first input node of said main amplifier;
   a first resistor coupled between said output node of said correction amplifier and said second input node of said main amplifier, and
   a second resistor coupled between second input node of said correction amplifier said second input node of said main amplifier.

2. A power amplifier circuit comprising:
   a main amplifier having first and second input nodes and an output node;
   a feedback resistor coupled between said first input node and said output node of said main amplifier;
   a correction loop amplifier having first and second input nodes and an output node, wherein said first input node of said correction amplifier is coupled to said first input node of said main amplifier;
   a first resistor coupled between said output node of said correction amplifier and said second input node of said main amplifier,
   a differential signal input having a first signal input node and a second signal input node, and
   a third resistor coupled between said second input node of said correction amplifier and said first signal input node, and a fourth resistor coupled between said second input node of said main amplifier and said first signal input node.

3. A power amplifier circuit comprising:
   a main amplifier having first and second input nodes and an output node;
   a feedback resistor coupled between said first input node and said output node of said main amplifier;
   a correction loop amplifier having first and second input nodes and an output node, wherein said first input node of said correction amplifier is coupled to said first input node of said main amplifier;
   a first resistor coupled between said output node of said correction amplifier and said second input node of said main amplifier,
   a differential signal input having a first signal input node and a second signal input node, and
   a fifth resistor coupled between said first input node of said main amplifier and said second signal input node.

4. A power amplifier circuit comprising:
   a main amplifier having first and second input nodes and an output node;
   a feedback resistor coupled between said first input node and said output node of said main amplifier;
   a correction loop amplifier having first and second input nodes and an output node, wherein said first input node of said correction amplifier is coupled to said first input node of said main amplifier;
   a first resistor coupled between said output node of said correction amplifier and said second input node of said main amplifier, and
   a single ended signal input.

5. The circuit of claim 4, further comprising a fourth resistor coupled between said second input node of said main amplifier and said single ended signal input, wherein said power amplifier circuit provides positive gain.

6. The circuit of claim 4, further comprising a fifth resistor coupled between said first input node of said main amplifier and said single ended signal input, wherein said power amplifier circuit provides negative gain.

7. A differential output amplifier circuit for generating a balanced output signal having positive and negative signal components, said circuit comprising:
   a first power amplifier circuit for providing said positive signal component of said balanced output signal, said first power amplifier circuit comprising
      a first main amplifier having first and second input nodes and an output node;
      a first feedback resistor coupled between said first input node and said output node of said first main amplifier;
      a first correction loop amplifier having first and second input nodes and an output node, wherein said first input node of said first correction amplifier is coupled to said first input node of said first main amplifier; and
      a first resistor coupled between said output node of said first correction amplifier and said second input node of said first main amplifier; and
   a second power amplifier circuit for providing said negative signal component of said balanced output signal, said second power amplifier circuit comprising
      a second main amplifier having first and second input nodes and an output node;
      a second feedback resistor coupled between said first input node and said output node of said second main amplifier;
      a second correction loop amplifier having first and second input nodes and an output node, wherein said first input node of said second correction amplifier is coupled to said first input node of said second main amplifier; and
      a second resistor coupled between said output node of said second correction amplifier and said second input node of said second main amplifier.

8. The circuit of claim 7, wherein said power amplifier circuit comprises a differential signal input having a first signal input node and a second signal input node.

9. The circuit of claim 7, wherein said power amplifier circuit comprises a single ended signal input.

10. A method of correcting distortion in an amplifier circuit, the amplifier circuit comprising a main amplifier and a correction amplifier, the main amplifier having first and second input nodes and an output node, the correction amplifier having first and second input nodes and an output node, said method comprising:

feeding back an output signal from said main amplifier output node to said main amplifier first input node via a first resistor;

feeding back said output signal to said correction amplifier first input node via said resistor;

generating a correction signal at said output node of said correction amplifier;

providing said correction signal to said main amplifier second input node via a second resistor; and receiving a differential signal input at said main amplifier first and second input nodes.

11. The method of claim 10, further comprising said power amplifier circuit filtering said differential signal input, said filtering selected from the group consisting of: low pass, high pass, and band pass.

12. A method of correcting distortion in an amplifier circuit, the amplifier circuit comprising a main amplifier and a correction amplifier, the main amplifier having first and second input nodes and an output node, the correction amplifier having first and second input nodes and an output node, said method comprising:

feeding back an output signal from said main amplifier output node to said main amplifier first input node via a first resistor;

feeding back said output signal to said correction amplifier first input node via said resistor;

generating a correction signal at said output node of said correction amplifier;

providing said correction signal to said main amplifier second input node via a second resistor, and further comprising receiving a single ended signal input at one of said main amplifier first and second input nodes.

13. A method of correcting distortion in an amplifier circuit, the amplifier circuit comprising a main amplifier and a correction amplifier, the main amplifier having first and second input nodes and an output node, the correction amplifier having first and second input nodes and an output node, said method comprising:

feeding back an output signal from said main amplifier output node to said main amplifier first input node via a first resistor;

feeding back said output signal to said correction amplifier first input node via said resistor;

generating a correction signal at said output node of said correction amplifier;

providing said correction signal to said main amplifier second input node via a second resistor; and wherein said power amplifier circuit performs negative gain on an input signal.

14. A method of correcting distortion in an amplifier circuit, the amplifier circuit comprising a main amplifier and a correction amplifier, the main amplifier having first and second input nodes and an output node, the correction amplifier having first and second input nodes and an output node, said method comprising:

feeding back an output signal from said main amplifier output node to said main amplifier first input node via a first resistor;

feeding back said output signal to said correction amplifier first input node via said resistor;

generating a correction signal at said output node of said correction amplifier;

providing said correction signal to said main amplifier second input node via a second resistor; and generating a differential signal output.

* * * * *